(12) United States Patent
Tan

(10) Patent No.: US 7,724,026 B1
(45) Date of Patent: May 25, 2010

(54) SINGLE-ENDED INPUT-OUTPUT BLOCK WITH REDUCED LEAKAGE CURRENT

(75) Inventor: Sing-Keng Tan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/269,750

(22) Filed: Nov. 12, 2008

(51) Int. Cl.
*H03K 17/16* (2006.01)
*H03K 19/003* (2006.01)

(52) U.S. Cl. .................. 326/30; 326/32; 326/34

(58) Field of Classification Search ............ 326/30, 326/32–34
See application file for complete search history.

(56) References Cited

U.S. PATENT DOCUMENTS 6,924,659 B1 *   8/2005   Andrews et al. ............ 326/30
2007/0290712 A1 *  12/2007   Gomez et al. ............. 326/30

* cited by examiner

*Primary Examiner*—Anh Q Tran
(74) *Attorney, Agent, or Firm*—Scott Hewett; Lois D. Cartier

(57) ABSTRACT

An integrated circuit has a differential I/O buffer (102) capable of being operated in a single-ended mode. The I/O buffer includes circuitry (114 or 112) for reducing leakage current between the differential I/O pins (P, N) when an undershoot event occurs on a pin when operated single-ended mode. In one case, a differential termination circuit (114, 200) includes a differential termination isolation circuit (202) that isolates the termination load (201) and termination load switch (208) from the single-ended pin. Alternatively or additionally, a differential output driver (300) of the I/O buffer switches a common bias voltage (ncom) to a supply voltage ($V_{COO}$) in single-ended mode to insure the transistors (A2, B1) in the driver legs remain OFF during an undershoot event.

14 Claims, 6 Drawing Sheets

SINGLE-ENDED INPUT-OUTPUT BLOCK WITH REDUCED LEAKAGE CURRENT

FIELD OF THE INVENTION

This invention relates generally to integrated circuits ("ICs"), and more particularly to techniques for reducing leakage current between differential pins of an input-output block during undershoot.

BACKGROUND OF THE INVENTION

Many ICs are made up of millions of interconnected devices, such as transistors, resistors, capacitors, and diodes, on a single chip of semiconductor substrate. CMOS circuits and fabrication technology are commonly used in complex ICs. CMOS circuits use PMOS and NMOS devices to implement functions such as logic and input/output ("I/O") blocks.

An I/O block is a circuit in an IC that receives or sends data from or to other ICs. Signals can be differential (i.e., a HI/LOW or LOW/HI signal is simultaneously provided on differential I/O pins) or single-ended (i.e., either a HI signal or a LOW signal is provided on a single pin). In some ICs I/O blocks can operate on either differential signals or on single-ended signals. When the I/O block operates in differential mode, an on-die differential termination is provided to terminate the differential path with an appropriate impedance (load resistor). When the I/O block operates in single ended mode, the differential termination is turned off.

However, if an undershoot occurs when an I/O block is being operated in single-ended mode, NMOS transistors can turn on and conduct if the undershoot exceeds the threshold voltage of the transistor(s). Undershoot can occur due to many factors, such as switch bounce, reflections from improperly terminated transmission lines, or inductive effects. Undershoot can cause leakage current to flow between the differential pins of an I/O block when it is operated in single-ended mode. For example, if the single-ended input pin is in transition from a HI signal to a LO signal, the falling edge of the pulse can undershoot and turn on transistors, allowing leakage current.

SUMMARY OF THE INVENTION

Disclosed here is an integrated circuit that enables reducing leakage current between differential pins of an I/O block operated in single-ended mode during an undershoot event. Undershoot can occur due switch bounce, reflections from improperly terminated transmission lines, inductive effects or other reasons.

An integrated circuit has a differential I/O buffer capable of being operated in a single-ended mode. The I/O buffer includes circuitry for reducing leakage current between the differential I/O pins when an undershoot event occurs on the single-ended pin. In one case, a differential termination circuit includes a differential termination isolation circuit that isolates the termination load and termination load switch from the single-ended pin. Alternatively or additionally, a differential output driver of the I/O buffer switches a common bias voltage to a supply voltage in single-ended mode to insure the transistors in the driver legs remain OFF during an undershoot event.

DETAILED DESCRIPTION

Figure 1:
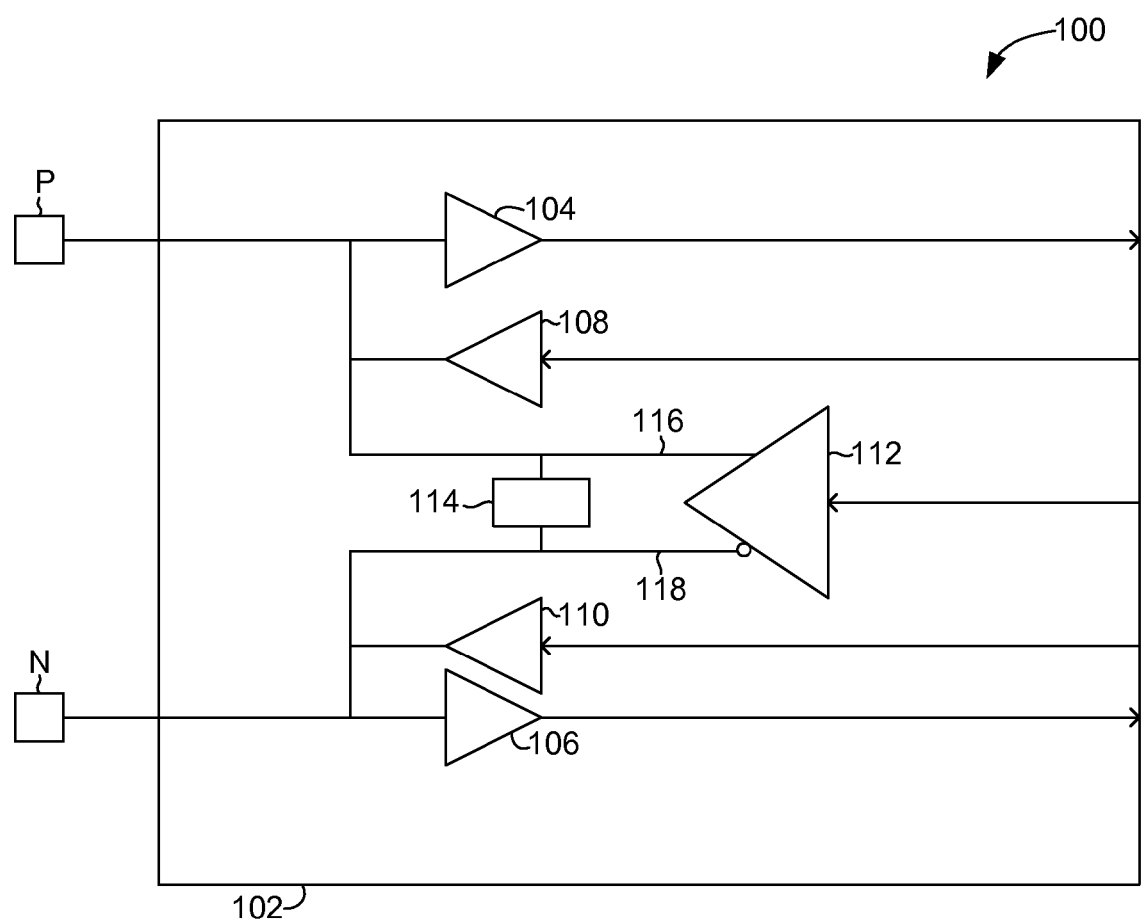
FIG. 1 is a diagram of an I/O block according to an embodiment.

FIG. 1 is a diagram of a differential I/O block 100 according to an embodiment. The differential I/O block 100 includes a first differential pin P and a second differential pin N. An input/output buffer 102 includes a first input buffer 104 connected to the first differential pin P and a second input buffer 106 connected to the second differential pin N. The input/output buffer 102 also includes a first single-ended output driver 108 connected to the first differential pin P, a second single-ended output driver 110 connected to the second differential pin N, a differential output driver 112 connected to the first and second differential pins P, N, and an on-die differential termination 114 between the outputs 116, 118 of the differential output driver 112.

In single ended mode, during an undershoot event on the first differential pin P, where the undershoot voltage exceeds the threshold voltage of an NMOS transistor in either the on-die differential termination 114 or the differential output driver 112, leakage current can flow from the first differential pin P through the on-die differential termination 114 or differential output driver 112, to the second differential pin N, which causes a data error on pin N. The on-die differential termination 114 or the differential output driver 112, or both, incorporate techniques according to one or more embodiments to reduce leakage current between the differential pins P, N.

The differential I/O block 100 enables both differential and single-ended modes. The on-die differential termination 114 is disabled in single-ended configuration. The differential output driver 112 is tri-stated when the I/O block 100 is configured for single-ended operation. This means that the logic state of the differential output driver 112 is high-impedance, which basically removes the output node from the circuit.

Figure 2A:
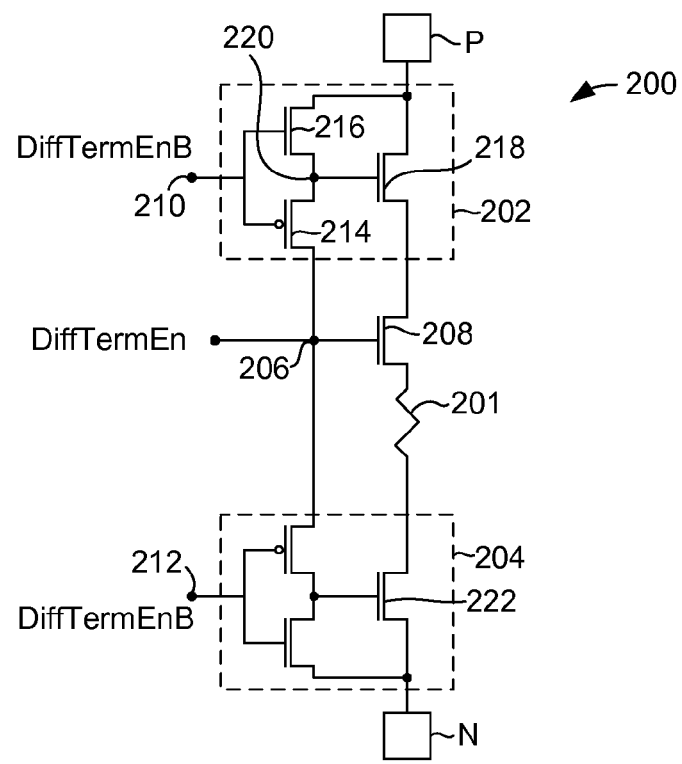
FIG. 2A is a diagram of an on-die differential termination circuit according to an embodiment.

FIG. 2A is a diagram of an on-die differential termination circuit 200 according to an embodiment. The on-die differential termination circuit 200 can be used as on-die differential termination 114 in the differential I/O block 100 of FIG. 1, for example.

When the differential I/O block is operating in differential mode, a termination (load) resistor 201 is switched in between the differential pins P, N by operation of a switch (NMOS FET 208). When the I/O block is operating in single-ended mode, the termination resistor 201 is switched out or otherwise disabled.

The on-die differential termination circuit 200 includes a first differential termination isolation circuit 202 and a second differential termination isolation circuit 204. During single-ended operation, a Differential Termination Enable signal ("DiffTermEn") at control (gate) node 206 is set to a LO value, turning the NMOS transistor 208 OFF and isolating the termination resistor 201 from the differential pin P. Without the first and second differential termination isolation circuits 202, 204, the NMOS transistor 208 could turn ON during an undershoot event and conduct current between the P and N terminals (see, FIG. 1), since the source voltage of the NMOS transistor 208 is at a negative voltage. The logical opposite (i.e., a HI value), Differential Termination Enable Bar ("DiffTermEnB"), is coupled to a first terminal 210 of the first differential termination isolation circuit 202, and is also coupled to a second terminal 212 of the second differential termination isolation circuit 204.

The HI signal on the terminal 210 (during single-ended operation) turns PMOS transistor 214 OFF and NMOS transistor 216 ON, which allows the source voltage of NMOS transistor 218 to be coupled to (i.e., be passed through to) its own gate node 220 through NMOS transistor 216 and isolates the control node 206 from the differential pin P. The transistors in the second differential termination isolation circuit 204 operate in a similar fashion. The first and second differential termination isolation circuits 202, 204 insure that the NMOS transistor (switch) 208 remains OFF, even during an undershoot event and block leakage current from flowing between the differential pins P, N.

During single-ended operation, $V_{GATE} - V_{SOURCE}$ of NMOS transistor 218 is always equal to or lower than its threshold voltage, which insures that NMOS transistor 218 remains OFF during an undershoot event, isolating the differential termination resistor 201 from the differential pin P. Since the NMOS transistor 208 is in series with NMOS transistor 218, NMOS transistor 208 will not conduct leakage current between differential pins P, N if an undershoot event occurs at pin P. If the N pin is used in single-ended operation, leakage current between the pins P, N is similarly blocked if an undershoot event occurs on the pin N.

When the I/O block is operated in differential mode, a HI differential termination enable signal is coupled to node 206, which turns NMOS FET 208 ON. A LO signal is coupled to the differential termination enable BAR node 210, which turns PMOS FET 214 ON and NMOS FET 216 OFF (and similarly for the second differential termination isolation circuit 204). The HI logic value of DiffTermEn is passed through PMOS FET 214 to node 220, turning on NMOS FET 218 (and similarly turning on NMOS FET 222) to couple the differential termination resistor 201 in series between differential pins P, N.

Figure 2B:
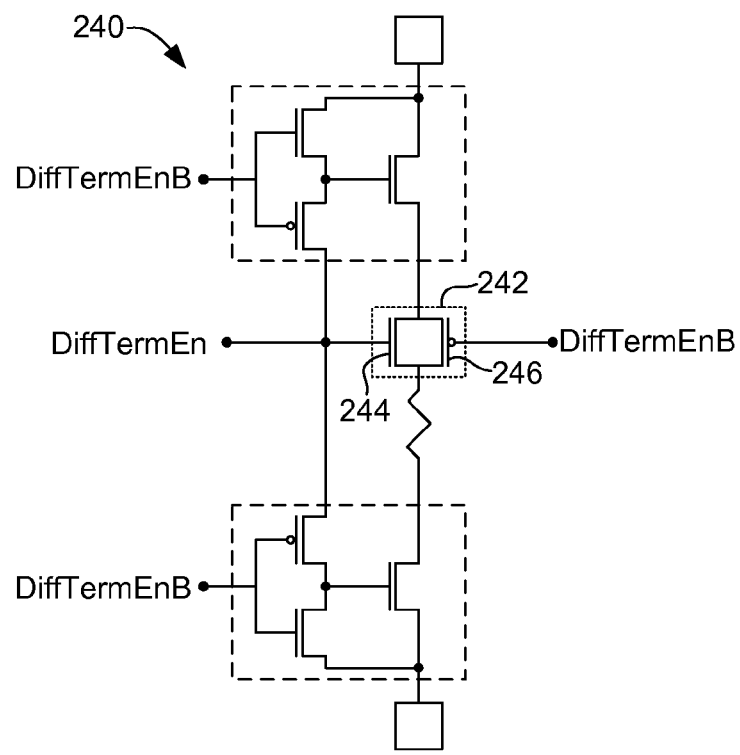
FIG. 2B is a diagram of an on-die differential termination circuit according to an alternative embodiment.

FIG. 2B is a diagram of an on-die differential termination circuit 240 according to an alternative embodiment. A transmission gate 242 is used instead of the NMOS FET switch 208 of FIG. 2A. The transmission gate 242 uses an NMOS FET 244 in parallel with a PMOS FET 246. The NMOS FET 244 is controlled by a differential termination enable signal, and the PMOS FET 246 is controlled by the opposite, namely the differential termination enable BAR signal. The on-die differential termination circuit 240 operates in a substantially similar fashion to the on-die differential termination circuit 200 of FIG. 2A, and a detailed description of operation is omitted, as the operation of the common portions of the circuits would be clear to one of skill in the art.

Figure 3A:
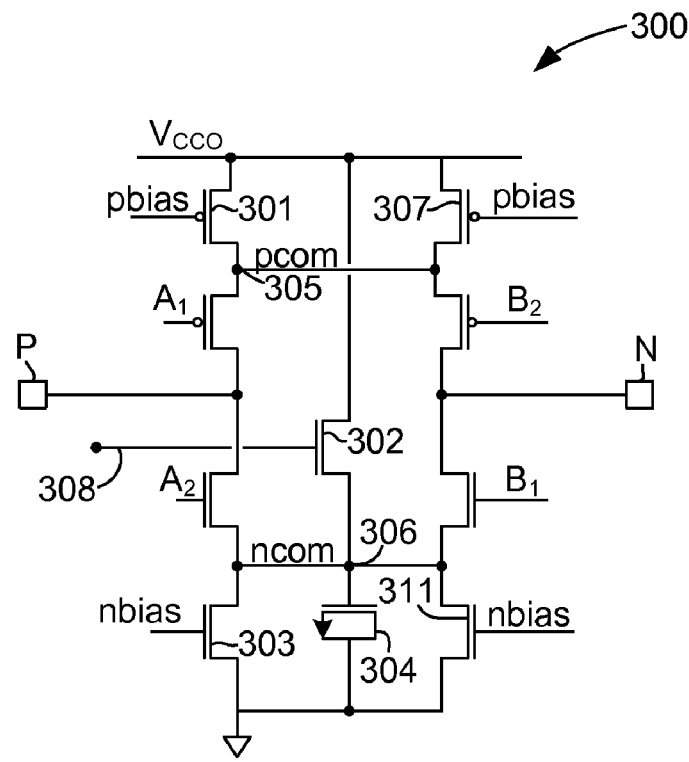
FIG. 3A is a diagram of a differential output driver according to an embodiment.

Using the PMOS FET 246 in parallel with the NMOS FET 244 in the transmission gate 242 helps to minimize the dominance of the NMOS FET's ON resistance, which is especially desirable when the differential I/O block in a low-voltage application. The ON resistance of the NMOS FET increases exponentially when the power supply voltage decreases. By minimizing the dominance of the ON resistance of the NMOS FET, less differential termination resistance arises from variations by the power supply voltage. Hence, the differential termination resistance is less variable. FIG. 3A is a diagram of a differential output driver 300 according to an embodiment. The differential output driver 300 is used as the differential output driver 112 in the differential I/O block 100 of FIG. 1, for example. The differential output driver 300 uses an NMOS FET 302 as a pull-up transistor and an optional NMOS FET 304 configured as a capacitor ("capacitor 304") to reduce leakage current between differential pins P, N during an undershoot event. The capacitor is not necessary in all embodiments; however, the capacitor helps to reduce the peak voltage of an undershoot event and helps to clamp the common NMOS voltage (ncom), which stabilizes the N portion of the output current source(s). An undershoot event on differential pin P could turn on NMOS FET A2, and an undershoot event on differential pin N could turn on NMOS FET B1. The following discussion will use an undershoot event on differential pin P as an example.

The differential output driver has parallel driver legs between a power supply ($V_{CCO}$) and a current sink/source (which will be referred to as a "current sink" for purposes of discussion), such as ground. A first driver leg ("P driver leg") has PMOS FETs 301, A1 in series with NMOS FETs A2, 303. A node 305 between the PMOS FETS in the first driver leg is connected (pcom) between PMOS FETs 307, B2 in the second driver leg ("N driver leg"), and a node 306 between the NMOS FETs A2, 303 in the first driver leg is connected (ncom) between NMOS FETs B1, 311 in the second driver leg. A switch (NMOS FET) 302 selectively couples the power supply to the common NMOS connection ncom (node 306). A capacitor 304 charges when the switch 302 is closed, and maintains voltage on node 306 when the switch is opened.

When an undershoot event occurs while the differential I/O block (see, FIG. 1, ref. num. 100, 112) is being operated in single-ended mode, the NMOS FET A2 can turn ON if $V_{GATE} - V_{SOURCE} > V_{THRESHOLD}$. Once NMOS FET A2 is turned ON the common N voltage node (ncom) 306 would otherwise drop to a negative voltage level, turning on NMOS B1 and leakage current flows between differential pins P, N. Similarly, leakage current can flow between differential pins P, N if an undershoot event occurs at pin N. A common P voltage (pcom) similarly ties the drains of PMOS FETS A1 and B2 together. The PFETs 301, 307 and NFETs 303, 311 are biased at the desired biasing voltages to be a P-current sources and N-current sources, respectively.

The NMOS FET 302 keeps the ncom voltage at node 306 at least $V_{THRESHOLD}$ higher than the gate voltage of NMOS FET B1, thus, NMOS FET B1 will not be turned on by an undershoot event. The capacitor 304 is charged to $V_{CCO}$ when the NMOS FET 302 is ON. When the NMOS FET 302 is OFF, the capacitor 304 helps to clamp the ncom voltage at the desired level. The NMOS FET 302 is always ON in single-ended mode in order to pull up the ncom node, and is always OFF in differential mode. In differential mode, the ncom voltage may fluctuate due to noise coupling through NMOS FETs A2 and B1. The capacitor 304 helps to clamp the ncom voltage to insure that NMOS FETs 303 and 311 have a constant drain-to-source voltage. As a result, the current from the NMOS FETs current source will have less variation.

In differential mode, the ncom voltage is an internal node and will not be pulled up to VCCO because the switch 302 is OPEN. In differential mode, it is desirable to maintain the ncom voltage level above nbias-Vthreshold. The NMOS FETs 303 and 311 operate in saturation mode as current sources that provide constant current. The ncom voltage level varies depending on process, temperature, and power supply voltage level.

In single-ended mode, the control voltage to the gate 308 of NMOS FET (switch) 302 is HI. The differential output drive to the differential pins P, N is tri-stated (i.e., at a high impedance), the gate voltage of NMOS FETs A2 and B1 are at a LO value and the gates of PMOS FETs A1 and B2 are biased at a HI value (thus, both pairs of FETs are OFF). The ncom voltage at node 306 is pulled to the $V_{cco}$ power rail to insure that the ncom voltage is always greater than the gate voltage of NMOS FETs A2 and B1. As a result, NMOS FET B1 will not turn ON due to an undershoot event on differential pin P, and NMOS FET A2 will not turn ON due to an undershoot event on differential pin N.

When operated in differential mode, the control voltage to the gate 308 of NMOS FET 302 is LO, turning NMOS FET 302 OFF. Node 306 is disconnected from $V_{cco}$; however, capacitor 304 maintains the common NMOS voltage (ncom) at node 306. The capacitor 304 minimizes fluctuations of the ncom voltage level that might otherwise arise due to coupling noise from the switching activity at the gate of A2 and B1. Transistors A1, B2, A2, B1 are switches that control the current flow to indicate output HI or LO. A1 and B1 are turned ON, while A2 and B2 are turned OFF to direct the current flow from pin P to pin N through differential termination at receiver, or vice versa. The differential output driver 300 operates to drive both differential pins P, N.

Figure 3B:
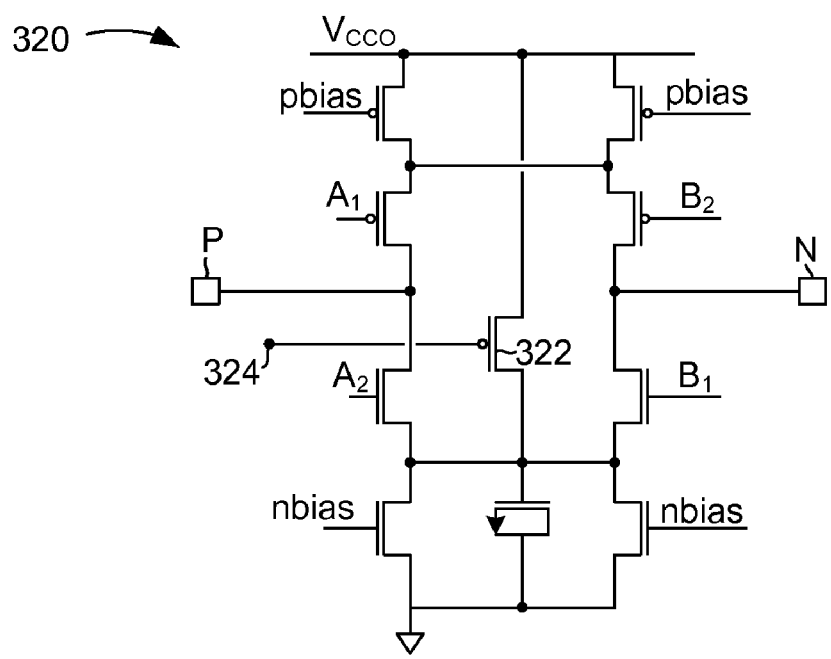
FIG. 3B is a diagram of a differential output driver according to an alternative embodiment.

FIG. 3B is a diagram of a differential output driver 320 according to an alternative embodiment. A PMOS FET 322 is used as the pull-up transistor instead of the NMOS FET 302 shown in FIG. 3A. The control signal that turns on PMOS FET 322 is a LO logic value, which is enabled when the differential output driver is being operated in single-ended mode. A HI logic value to the gate terminal 324 of PMOS FET 322 is enabled when the differential output driver is being operated in differential mode.

Figure 4:
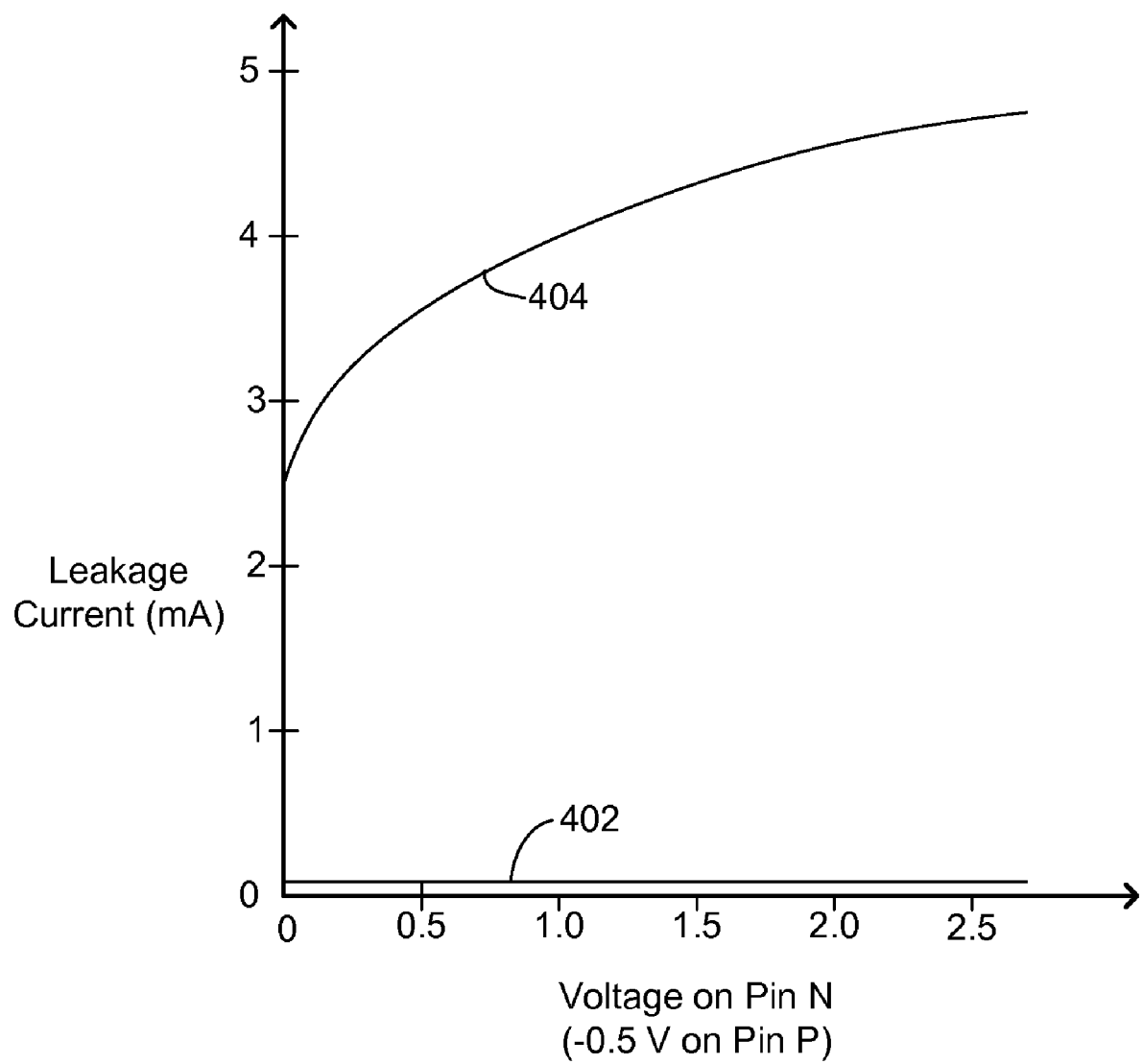
FIG. 4 shows plots of simulated leakage current versus the voltage present on a differential pin for an embodiment of a differential I/O buffer operated in single-ended mode and a conventional differential I/O buffer.

FIG. 4 shows plots of simulated leakage current in milliamps versus the voltage present on differential pin N for an embodiment of a differential I/O buffer 102 in accordance with FIG. 1 including an on-die differential termination in accordance with FIG. 2A and a differential output driver in accordance with FIG. 3A operated in single-ended mode, and a conventional differential I/O buffer. The undershoot voltage on differential input pin P is 0.5 V. The simulated leakage current is shown in plot 402.

The simulated leakage current for a conventional differential I/O buffer is shown in plot 404. The simulated circuit for the conventional differential I/O buffer does not have the first and second differential termination isolation circuits (see, FIG. 2A, ref. nums. 202, 204) in the on-die differential termination and does not have a pull-up transistor or capacitor (see, FIG. 3A, ref. nums. 302, 304).

Figure 5A:
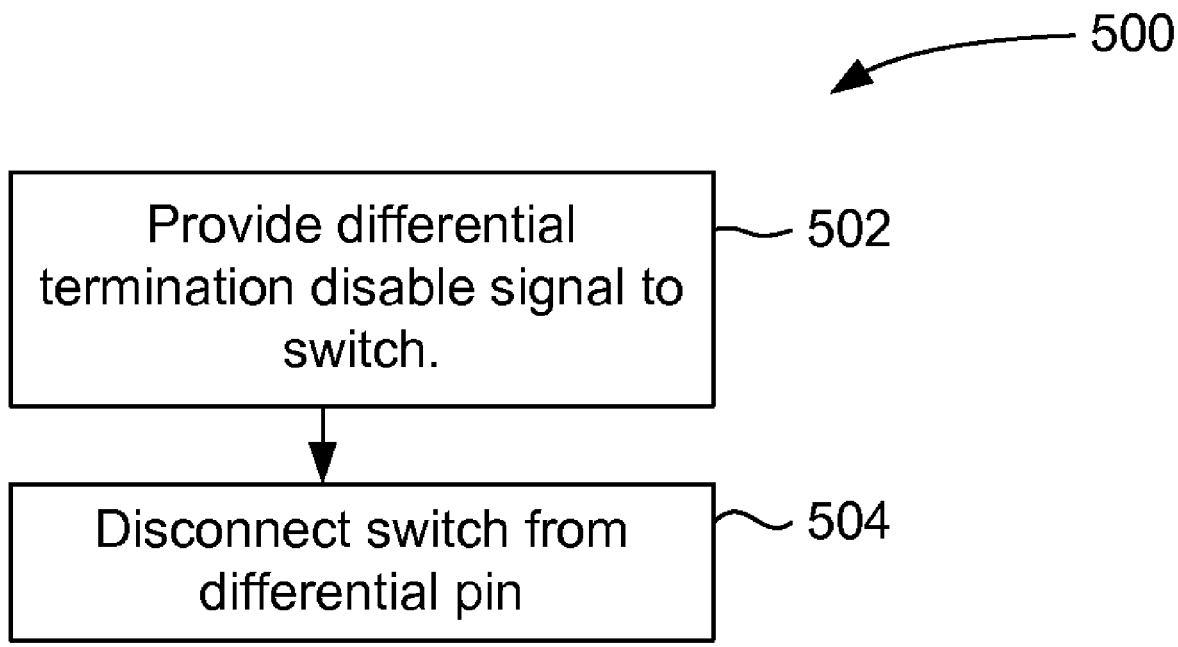
FIG. 5A is a flow chart of a method of operating a differential I/O buffer in single-ended mode with an on-die differential termination according to an embodiment.

FIG. 5A is a flow chart of a method 500 of operating a differential I/O buffer in single-ended mode with an on-die differential termination according to an embodiment. A differential termination disable signal is provided to the control terminal of a switch (see, e.g., FIG. 2A, ref. num. 208 or FIG. 2B, ref. num. 242) in series with a termination load (see, e.g., FIG. 2A, ref. num. 201 between first and second differential pins of the differential I/O buffer (step 502) to disconnect the series termination load from the first differential pin. A differential termination isolation circuit between a first differential pin and the switch is actuated so as to isolate the switch from the first differential pin during a voltage undershoot event on the first differential pin (step 504).

Figure 5B:
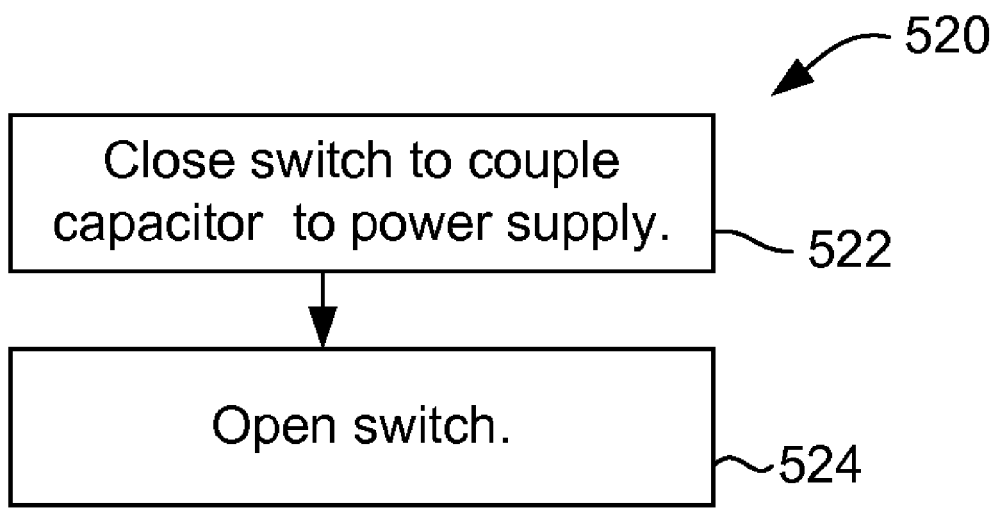
FIG. 5B is a flow chart of a method of operating a differential I/O buffer in single-ended mode with a differential output driver according to an embodiment.

FIG. 5B is a flow chart of a method 520 of operating a differential I/O buffer with a differential output driver according to an embodiment. A first NMOS FET in a first differential driver leg of the differential output buffer has a common source connection (node 306 in FIG. 3A) to a second NMOS FET in a second differential driver leg of the differential output buffer. A capacitor is connected between the node 306 and ground. During single-ended mode, a switch is closed (step 522) to connect a power supply of the differential output driver to the common source connection (node 306) and the capacitor. Closing the switch connects the common source connection to the power supply and charges the capacitor to approximately the power supply voltage minus the threshold voltage of the switch. After operating in single-ended mode, the I/O buffer is operated in differential mode by opening the switch (step 524).

Figure 6:
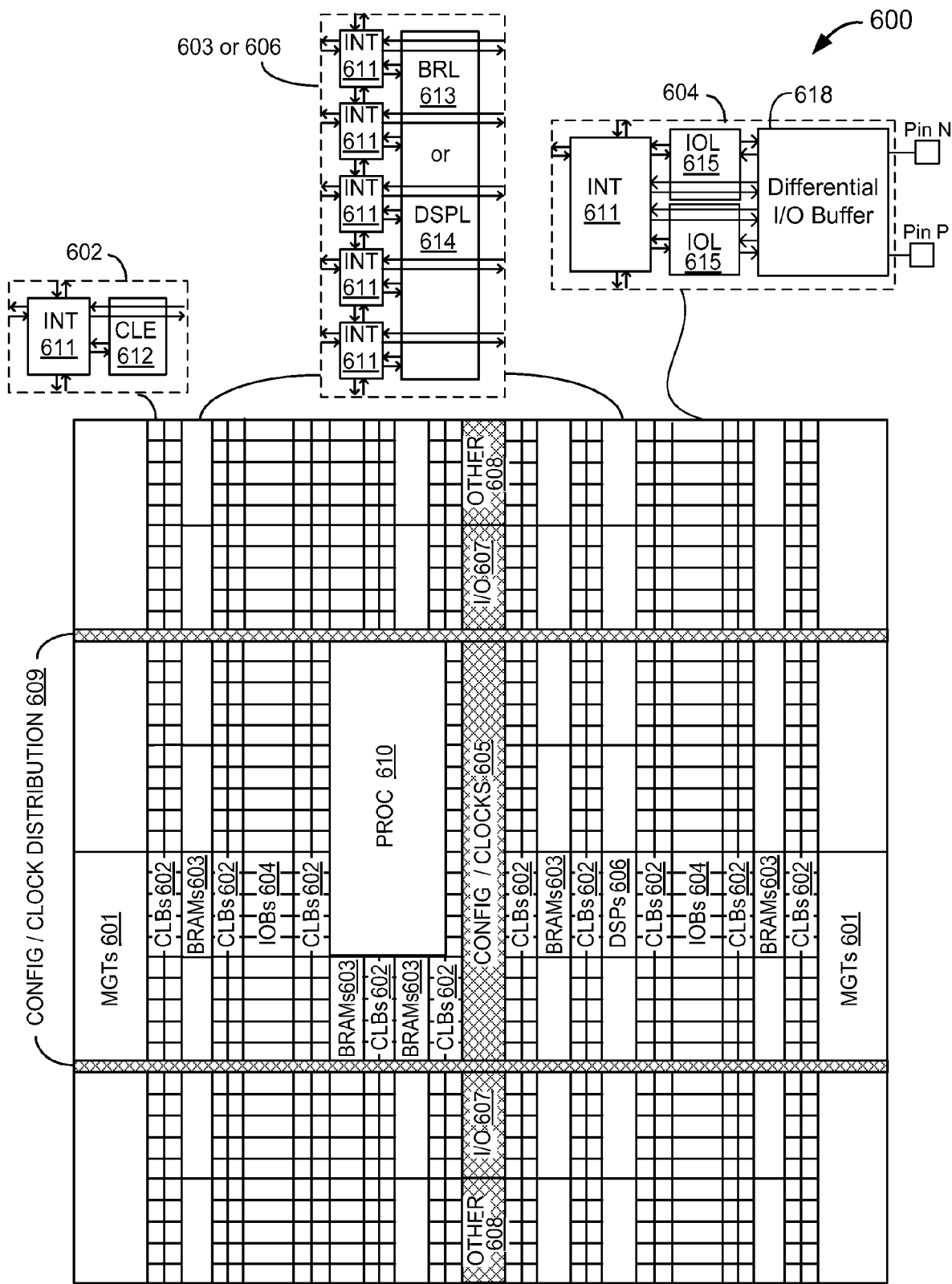
FIG. 6 is a plan view of an FPGA according to an embodiment.

FIG. 6 is a plan view of an FPGA 600 according to an embodiment. The FPGA is fabricated using a CMOS fabrication process and incorporates one or more differential I/O buffers according to one or more embodiments of the invention in one or more functional blocks. For example, a differential I/O buffer 618 according to an embodiment is included in an I/O block 604.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). A differential I/O buffer 618 is also part of IOB 604. As will be clear to those of skill in the art, the actual I/O pads connected, for example, to the differential I/O buffer 618 are manufactured using metal layers above the various illustrated logic blocks, and typically are not confined to the area of the input/output differential I/O buffer 618. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, fuses, array cores, logic gates, and control devices and circuits could be alternatively used. Therefore, the spirit and scope of the appended claims should not be limited to the foregoing description.

What is claimed is:

1. An integrated circuit comprising:
    an input/output ("I/O") buffer having
        a first differential pin;
        a second differential pin;
        a differential output driver connected to the first differential pin and to the second differential pin; and
        an on-die differential termination circuit including a termination load switchably connected between the first differential pin and the second differential pin, a first switch in series between the termination load and the first differential pin, the first switch having a control terminal, and a first differential termination isolation circuit connected between the first differential pin and the control terminal of the first switch, the first differential termination isolation circuit including a second switch disposed between the first differential pin and the termination load, a source voltage of the second switch being coupled to a gate of the second switch so as block current flow between the first differential pin and the second differential pin when the I/O buffer is operated in a single-ended mode.

2. The integrated circuit of claim 1 wherein the first differential termination isolation circuit comprises
    a first NMOS FET,
    a second NMOS FET, and
    a PMOS FET, the first NMOS FET being connected in series with the PMOS FET between the first differential pin and the control terminal, the first NMOS FET and PMOS FET having a common control terminal, the second NMOS FET being the second switch, the gate being coupled to the source voltage of the second switch through the first NMOS FET.

3. The integrated circuit of claim 2 wherein the first NMOS FET connects the source voltage of the second switch to the gate of the second switch and the PMOS FET is non-conductive when the I/O buffer is operated in the single-ended mode.

4. The integrated circuit of claim 1 further comprising a second differential termination isolation circuit connected between the second differential pin and the control terminal of the switch having a third switch between the second differential pin and the termination load.

5. The integrated circuit of claim 1 wherein the first switch is operated with a first control signal and the first differential termination isolation circuit is operated with a second control signal, the second control signal being an opposite logical value from the first control signal.

6. The integrated circuit of claim 1 wherein the first switch is an NMOS FET.

7. The integrated circuit of claim 1 wherein the first switch is transmission gate having an NMOS FET in parallel with a PMOS FET.

8. The integrated circuit of claim 1 wherein the differential output driver has
    a first differential driver leg having a first NMOS FET between the first differential pin and a node in series with a second NMOS FET between the node and a current sink,
    a second differential driver leg having a third NMOS FET between the second differential pin and the node in series with a fourth NMOS FET between the node and the current sink, and
    a third switch disposed between a power supply and the node connecting the power supply to the node when the I/O buffer is operated in single-ended mode and disconnecting the node from the power supply when the I/O buffer is operated in differential mode.

9. The integrated circuit of claim 8 further comprising a capacitor connected between the node and the current sink.

10. A method of operating an input/output ("I/O") buffer, comprising:
    providing a differential termination disable signal to a control node of an on-die differential termination circuit of the I/O buffer;
    isolating a termination load of the on-die differential termination circuit in series between a first differential in and a second differential in of the I/O buffer from the first differential pin by opening a first switch in series between the first differential pin and the second differential pin, and also opening a second switch between the first differential pin and the termination load; and
    operating the I/O buffer in single-ended mode using the first differential in as a single-ended I/O pin;
    wherein the first switch is a first NMOS FET and the second switch is a second NMOS FET and the step of isolating the termination load includes coupling a source of the second NMOS FET to a gate of the second NMOS FET through a third NMOS FET, the third NMOS FET being controlled by an opposite control signal, the differential termination disable signal having a first digital control value, and the control signal having a second digital control value.

11. The method of claim 10 wherein the on-chip differential termination circuit further includes a PMOS FET in series with the third NMOS FET disposed between the gate of the second NMOS FET and the control node, and wherein the step of isolating the termination load further includes turning the PMOS FET OFF with the opposite control signal.

12. The method of claim 10 further comprising, before the step of operating the I/O buffer in single-ended mode, of switchably connecting a common bias node between a first driver leg and a second driver leg of a differential output driver to a voltage supply so as to maintain a source voltage of a first transistor in the first driver leg and of a second transistor in the second driver leg at a voltage of the voltage supply.

13. The method of claim 12 wherein the step of switchably connecting includes charging a capacitor between the common bias node and a current sink to the voltage of the voltage supply.

14. The method of claim 13 further comprising, after the step of operating the I/O buffer in single-ended mode, provoiding a differential termination enable signal to the control node of the on-die differential termination circuit of the I/O buffer; and operating the I/O buffer in a differential mode including operating the differential output driver with the common bias node at a capacitor voltage of the capacitor.

* * * * *